(12) United States Patent
Culp et al.

(10) Patent No.: US 8,336,008 B2
(45) Date of Patent: Dec. 18, 2012

(54) CHARACTERIZATION OF LONG RANGE VARIABILITY

(75) Inventors: James A. Culp, Newburgh, NY (US); Jerry D. Hayes, Georgetown, TX (US); Ying Liu, Austin, TX (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 515 days.

(21) Appl. No.: 12/569,421

(22) Filed: Sep. 29, 2009

(65) Prior Publication Data
US 2011/0078641 A1 Mar. 31, 2011

(51) Int. Cl.
*G06F 17/50* (2006.01)
(52) U.S. Cl. .............. 716/104; 716/55; 716/136
(58) Field of Classification Search ......... 716/55, 716/104, 136
See application file for complete search history.

(56) References Cited

U.S. PATENT DOCUMENTS

| | | | |
|---|---|---|---|
| 6,553,318 B2 * | 4/2003 | Mansky | 702/22 |
| 7,069,525 B2 | 6/2006 | Bhushan et al. | |
| 7,225,099 B1 * | 5/2007 | O'Dwyer | 702/130 |
| 7,383,521 B2 * | 6/2008 | Smith et al. | 716/114 |
| 2006/0253820 A1 | 11/2006 | Bzowy | |
| 2007/0118320 A1 | 5/2007 | Luo et al. | |

OTHER PUBLICATIONS

Balch, Bruce W. et al., "Method of Characterizing Perimeter Density", U.S. Appl. No. 12/117,270, filed May 5, 2008, abandoned Apr. 14, 2009, 22 pages.
Khang, Andrew B., "IC Layout and Manufacturability: Critical Links and Design Flow Implications", Proceedings of Twelfth International Conference on VLSI Design, Jan. 1999, pp. 100-105.
Mehrotra, Vikas, "Modeling the Effects of Systematic Process Variation on Circuit Performance", Submitted to the Department of Electrical Engineering and Computer Science May 21, 2001 in partial fulfillment of the requirements for the degree of Doctor of Philosophy in Electrical Engineering and Computer Science, 156 pages.

* cited by examiner

*Primary Examiner* — Thuan Do
(74) *Attorney, Agent, or Firm* — Stephen R. Tkacs; Stephen J. Walder, Jr.; Eustus O. Nelson

(57) ABSTRACT

Mechanisms are provided for characterizing long range variability in integrated circuit manufacturing. A model derivation component tests one or more density pattern samples, which are a fabricated integrated circuits having predetermined pattern densities and careful placement of current-voltage (I-V) sensors. The model derivation component generates one or more empirical models to establish range of influence of long range variability effects in the density pattern sample. A variability analysis component receives an integrated circuit design and, using the one or more empirical models, analyzes the integrated circuit design to isolate possible long range variability effects in the integrated circuit design.

23 Claims, 10 Drawing Sheets

CHARACTERIZATION OF LONG RANGE VARIABILITY

BACKGROUND

The present application relates generally to an improved data processing apparatus and method and more specifically to an apparatus and method for performing characterization of long range variability in integrated circuit fabrication.

Variability in manufacturing significantly affects cost and quality of a product. More particularly, in the fabrication of integrated circuit (IC) devices, as components become smaller and denser, variability in manufacturing may dramatically reduce the yield of a product. That is, variability in manufacturing may cause a percentage of devices to fail in actual usage or the testing phase when components do not perform as they were designed.

One type of variability is random dopant fluctuation (RDF). Random dopant fluctuation is a form of process variation resulting from variation in the implanted impurity concentration. In metal oxide semiconductor field effect transistors (MOSFET), for example, RDF in the channel region can alter the transistor's properties, especially threshold voltage. In newer process technologies, RDF has a larger effect because the total number of dopants is fewer, and the addition or deletion of a few impurity atoms can significantly alter transistor properties. RDF is a local form of process variation, meaning that two juxtaposed transistors may have significantly different dopant concentrations.

Layout dependent systematic variation has a long range effect. That is, the shapes of components in an integrated circuit may have variation effects over a larger portion of the product. Some forms of long range variability may include rapid thermal annealing (RTA) effects and polycrystalline (PC) silicon perimeter density effects. Rapid thermal processing (RTP) refers to a semiconductor manufacturing process that heats silicon wafers to high temperatures on a timescale of several seconds or less. During cooling, wafer temperatures must be brought down slowly so they do not break due to thermal shock. Rapid thermal annealing (RTA) is a subset of rapid thermal processing. RTA is a process used in semiconductor device fabrication that consists of heating a single wafer at a time in order to affect its electrical properties. Unique heat treatments are designed for different effects.

Long range variability has a longer radius of influence (ROI) and is more difficult to characterize. Long range variability, such as RTA effects and PC perimeter density effects, may account for 20-30% of total front-end-of-the-line (FEOL) variation. FEOL denotes the first portion of integrated circuit fabrication where the individual devices (e.g., transistors, resistors, etc.) are patterned in the semiconductor. FEOL generally covers everything up to, but not including, the deposition of metal layers.

SUMMARY

In one illustrative embodiment, a method, in a data processing system, is provided for characterizing long range variability in manufacturing an integrated circuit design. The method comprises fabricating one or more pattern samples. Each of the one or more pattern samples is an integrated circuit having a predetermined pattern and a plurality of current-voltage sensors. The method further comprises performing measurements across the plurality of current-voltage sensors, generating one or more empirical models based on the measurements, and receiving, by the data processing system, an integrated circuit design to be analyzed. The method further comprises applying, by the data processing system, the one or more empirical models to the integrated circuit design to identify potential problems due to long-range variability, generating, by the data processing system, variability analysis results based on application of the one or more empirical models to the integrated circuit design, and presenting, by the data processing system, the variability analysis results.

In another illustrative embodiment, a computer program product comprises a computer readable storage medium having a computer readable program recorded thereon. The computer readable program, when executed on a computing device, causes the computing device to receive an integrated circuit design to be analyzed, and apply one or more empirical models to the integrated circuit design to identify potential problems due to long-range variability. The one or more empirical models are generated by fabricating one or more pattern samples. Each of the one or more pattern samples is an integrated circuit having a predetermined pattern and a plurality of current-voltage sensors. The one or more empirical models are generated by performing measurements across the plurality of current-voltage sensors. The computer readable program further causes the computing device to generate variability analysis results based on application of the one or more empirical models to the integrated circuit design and present the variability analysis results.

In another illustrative embodiment, an apparatus comprises a processor and a memory coupled to the processor. The memory comprises instructions which, when executed by the processor, cause the processor to receive an integrated circuit design to be analyzed and apply one or more empirical models to the integrated circuit design to identify potential problems due to long-range variability. The one or more empirical models are generated by fabricating one or more pattern samples. Each of the one or more pattern samples is an integrated circuit having a predetermined pattern and a plurality of current-voltage sensors. The one or more empirical models are generated by performing measurements across the plurality of current-voltage sensors. The instructions further cause the processor to generate variability analysis results based on application of the one or more empirical models to the integrated circuit design and to present the variability analysis results.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide mechanisms for characterizing long range variability in integrated circuit manufacturing. A model derivation component tests one or more density pattern samples, which are fabricated integrated circuits having predetermined pattern densities and careful placement of current-voltage (I-V) sensors. The model derivation component generates one or more empirical models to establish range of influence of long range variability effects in the density pattern sample. A variability analysis component receives an integrated circuit design and, using the one or more empirical models, analyzes the integrated circuit design to isolate possible long range variability effects in the integrated circuit design.

Figure 1:
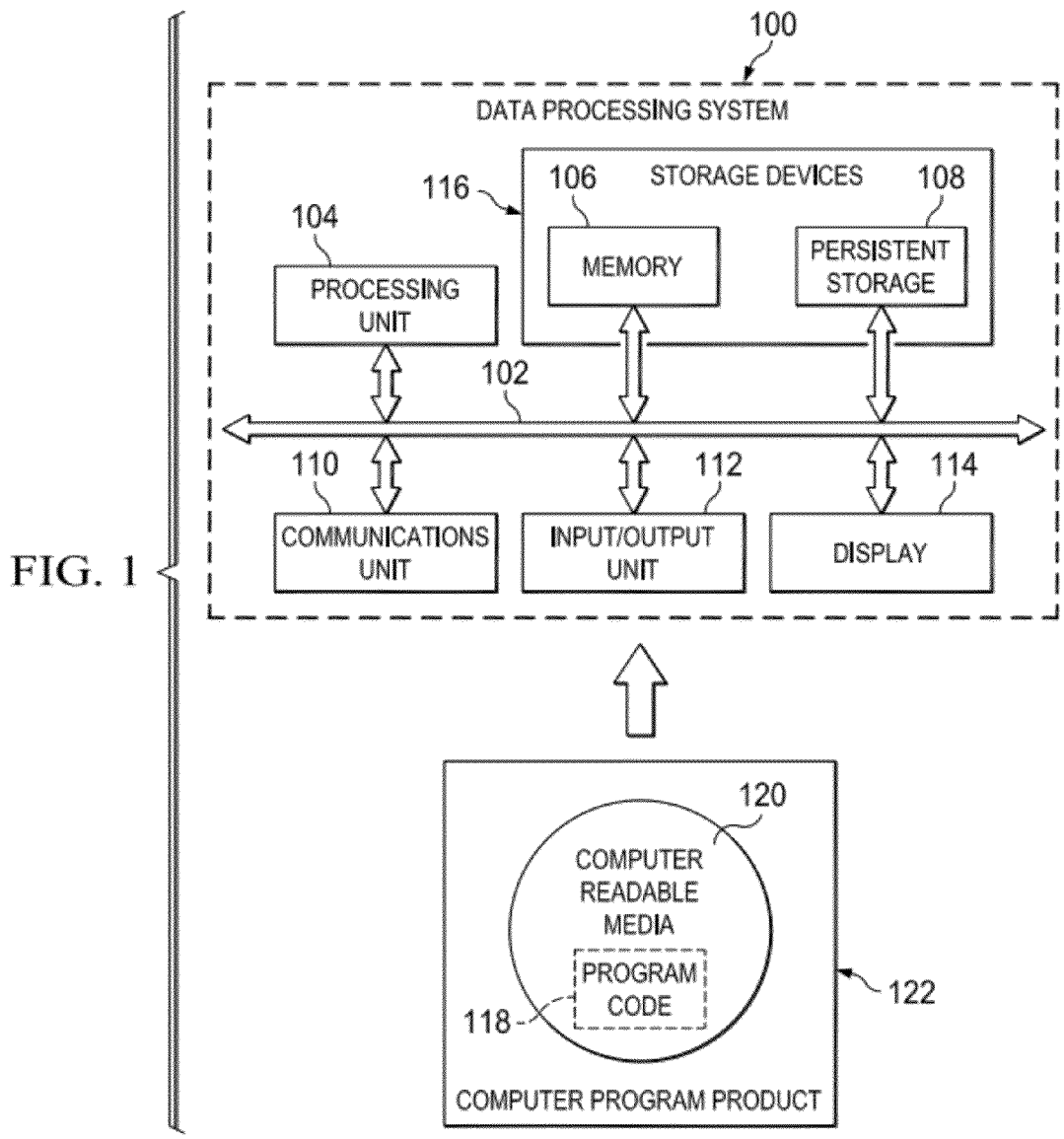
FIG. 1 depicts a block diagram of a data processing system in which illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIG. 1 is provided hereafter as an example environment in which aspects of the illustrative embodiments may be implemented. While the description following FIG. 1 will focus primarily on a single data processing device implementation, this is only an example and is not intended to state or imply any limitation with regard to the features of the present invention. To the contrary, the illustrative embodiments are intended to include distributed data processing environments and embodiments.

With reference now to the figures and in particular with reference to FIG. 1, an example diagram of a data processing environment is provided in which the illustrative embodiments may be implemented. It should be appreciated that FIG. 1 is only an example and is not intended to assert or imply any limitation with regard to the environments in which aspects or embodiments of the present invention may be implemented. Many modifications to the depicted environment may be made without departing from the spirit and scope of the present invention.

With reference now to the figures, FIG. 1 depicts a block diagram of a data processing system in which illustrative embodiments may be implemented. Data processing system 100 is an example of a computer, in which computer usable program code or instructions implementing the processes may be located for the illustrative embodiments. In this illustrative example, data processing system 100 includes communications fabric 102, which provides communications between processor unit 104, memory 106, persistent storage 108, communications unit 110, input/output (I/O) unit 112, and display 114.

Processor unit 104 serves to execute instructions for software that may be loaded into memory 106. Processor unit 104 may be a set of one or more processors or may be a multi-processor core, depending on the particular implementation. Further, processor unit 104 may be implemented using one or more heterogeneous processor systems in which a main processor is present with secondary processors on a single chip. As another illustrative example, processor unit 104 may be a symmetric multi-processor system containing multiple processors of the same type.

Memory 106 and persistent storage 108 are examples of storage devices 116. A storage device is any piece of hardware that is capable of storing information, such as, for example, without limitation, data, program code in functional form, and/or other suitable information either on a temporary basis and/or a permanent basis. Memory 106, in these examples, may be, for example, a random access memory or any other suitable volatile or non-volatile storage device. Persistent storage 108 may take various forms depending on the particular implementation. For example, persistent storage 108 may contain one or more components or devices. For example, persistent storage 108 may be a hard drive, a flash memory, a rewritable optical disk, a rewritable magnetic tape, or some combination of the above. The media used by persistent storage 108 also may be removable. For example, a removable hard drive may be used for persistent storage 108.

Communications unit 110, in these examples, provides for communications with other data processing systems or devices. In these examples, communications unit 110 is a network interface card. Communications unit 110 may provide communications through the use of either or both physical and wireless communications links.

Input/output unit 112 allows for input and output of data with other devices that may be connected to data processing system 100. For example, input/output unit 112 may provide a connection for user input through a keyboard, a mouse, and/or some other suitable input device. Further, input/output unit 112 may send output to a printer. Display 114 provides a mechanism to display information to a user.

Instructions for the operating system, applications and/or programs may be located in storage devices 116, which are in communication with processor unit 104 through communications fabric 102. In these illustrative examples the instructions are in a functional form on persistent storage 108. These instructions may be loaded into memory 106 for execution by processor unit 104. The processes of the different embodiments may be performed by processor unit 104 using computer implemented instructions, which may be located in a memory, such as memory 106.

These instructions are referred to as program code, computer usable program code, or computer readable program code that may be read and executed by a processor in processor unit 104. The program code in the different embodiments may be embodied on different physical or tangible computer readable media, such as memory 106 or persistent storage 108.

Program code 118 is located in a functional form on computer readable media 120 that is selectively removable and may be loaded onto or transferred to data processing system 100 for execution by processor unit 104. Program code 118 and computer readable media 120 form computer program product 122 in these examples. In one example, computer readable media 120 may be in a tangible form, such as, for example, an optical or magnetic disc that is inserted or placed into a drive or other device that is part of persistent storage 108 for transfer onto a storage device, such as a hard drive that is part of persistent storage 108. In a tangible form, computer readable media 120 also may take the form of a persistent storage, such as a hard drive, a thumb drive, or a flash memory that is connected to data processing system 100. The tangible form of computer readable media 120 is also referred to as computer recordable storage media. In some instances, computer readable media 120 may not be removable.

Alternatively, program code 118 may be transferred to data processing system 100 from computer readable media 120 through a communications link to communications unit 110 and/or through a connection to input/output unit 112. The communications link and/or the connection may be physical or wireless in the illustrative examples. The computer readable media also may take the form of non-tangible media, such as communications links or wireless transmissions containing the program code.

In some illustrative embodiments, program code 118 may be downloaded over a network to persistent storage 108 from another device or data processing system for use within data processing system 100. For instance, program code stored in a computer readable storage medium in a server data processing system may be downloaded over a network from the server to data processing system 100. The data processing system providing program code 118 may be a server computer, a client computer, or some other device capable of storing and transmitting program code 118.

The different components illustrated for data processing system 100 are not meant to provide architectural limitations to the manner in which different embodiments may be implemented. The different illustrative embodiments may be implemented in a data processing system including components in addition to or in place of those illustrated for data processing system 100. Other components shown in FIG. 1 can be varied from the illustrative examples shown. The different embodiments may be implemented using any hardware device or system capable of executing program code.

As another example, a storage device in data processing system 100 is any hardware apparatus that may store data. Memory 106, persistent storage 108 and computer readable media 120 are examples of storage devices in a tangible form.

In another example, a bus system may be used to implement communications fabric 102 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 106 or a cache such as found in an interface and memory controller hub that may be present in communications fabric 102.

In accordance with the illustrative embodiments, mechanisms are provided for characterizing long range variability in integrated circuit manufacturing. A model derivation component tests one or more density pattern samples, which are fabricated integrated circuits having predetermined pattern densities and careful placement of current-voltage (I-V) sensors. The model derivation component may be implemented in a data processing system, such as data processing system 100 in FIG. 1, for example. The model derivation component generates one or more empirical models to establish range of influence of long range variability effects in the density pattern sample. A variability analysis component receives an integrated circuit design and, using the one or more empirical models, analyzes the integrated circuit design to isolate possible long range variability effects in the integrated circuit design. The variability analysis component may be implemented in a data processing system, such as data processing system 100 in FIG. 1, for example.

Figure 2:
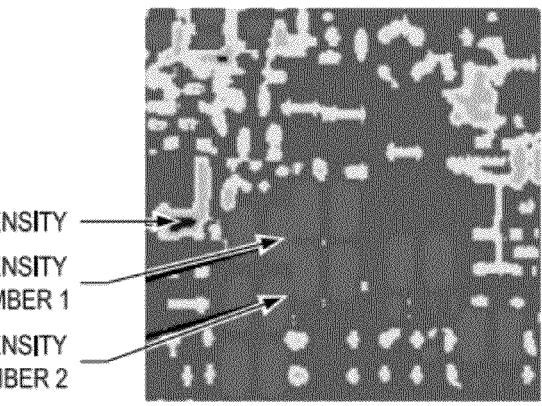
FIG. 2 depicts a top-down view of a fabricated integrated circuit having different PC perimeter densities.
Figure 3A:
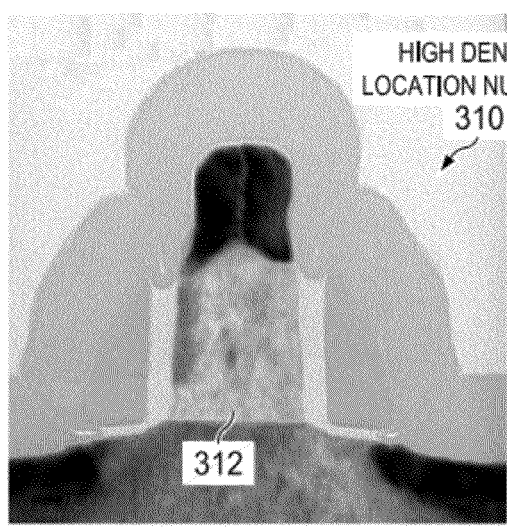
FIGS. 3A and 3B illustrate variation in transistor fabrication due to changes in PC perimeter density.
Figure 3B:
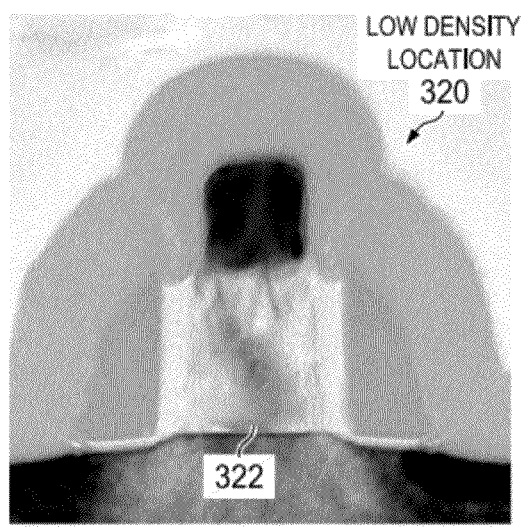

FIG. 2 depicts a top-down view of a fabricated integrated circuit having different PC perimeter densities. As shown in FIG. 2, the fabricated integrated circuit has an area with low density and two areas with high density (location #1 and location #2). FIGS. 3A and 3B illustrate variation in transistor fabrication due to changes in PC perimeter density. FIG. 3A depicts a cross-section of transistor 310, which is fabricated in high density location #1 shown in FIG. 2. FIG. 3B depicts a cross-section of transistor 320, which is fabricated in the area with low density shown in FIG. 2.

Figure 4:
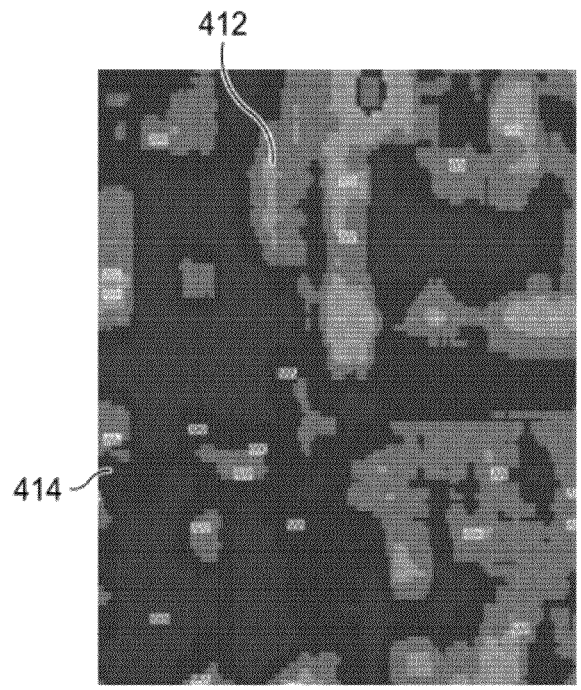
FIG. 4 illustrates a top-down view of a fabricated integrated circuit having different PC perimeter densities and rapid thermal annealing effects.

FIG. 4 illustrates a top-down view of a fabricated integrated circuit having different PC perimeter densities and rapid thermal annealing effects. Rapid thermal annealing is necessary to activate the dopant after implantation. To lower the thermal budget, it is necessary to speed up the annealing process. Disparity in the reflectivity of different materials causes non-uniform activation temperature. Therefore, using RTA, it is difficult to achieve thermal equilibrium. Furthermore, the radius of influence for RTA effects is large.

As shown in FIG. 4, various areas of the integrated circuit have different reflectivity. In the depicted example, lighter colors represent areas with higher reflectivity, which results in lower temperature, and darker colors represent areas with lower reflectivity, which results in higher temperature. For example, area 412 has a higher reflectivity than area 414. Therefore, area 412 has a lower temperature than area 414. The difference in temperature causes a difference in device characteristics that affect performance.

Performance screening ring oscillators (PSROs) may be used to quantify long range variability in a product. However, using PSROs, it is difficult to distinguish the effects from PC perimeter density from RTA effects. That is, it is difficult to derive mathematical models based on the measurement results from PSROs, and it is difficult to establish the radius of influence (ROI).

Figure 5:
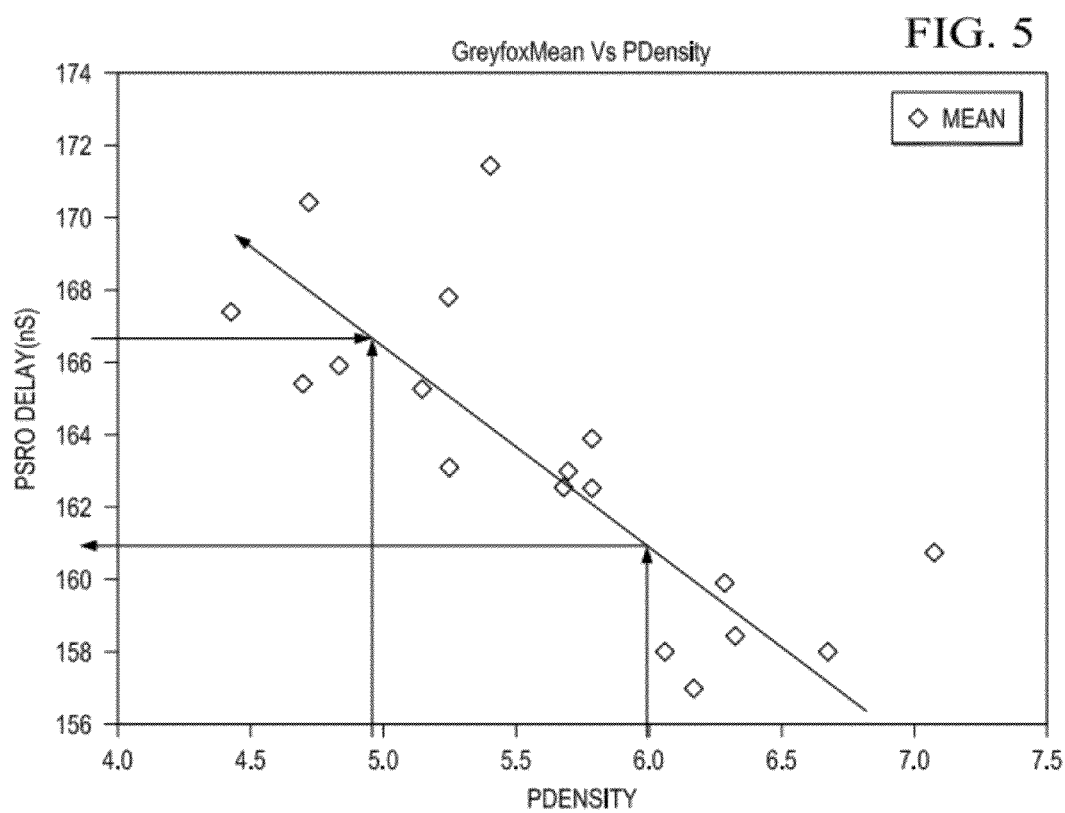
FIG. 5 is a graph depicting a correlation between performance variations and perimeter density in accordance with an illustrative embodiment.

FIG. 5 is a graph depicting a correlation between performance variations and perimeter density in accordance with an illustrative embodiment. As can be seen in FIG. 5, measuring performance screening ring oscillator (PSRO) delay versus PC perimeter density is a crude way to verify that there is a correlation. However, the correlation shown in FIG. 5 does not pinpoint the problem.

Figure 6:
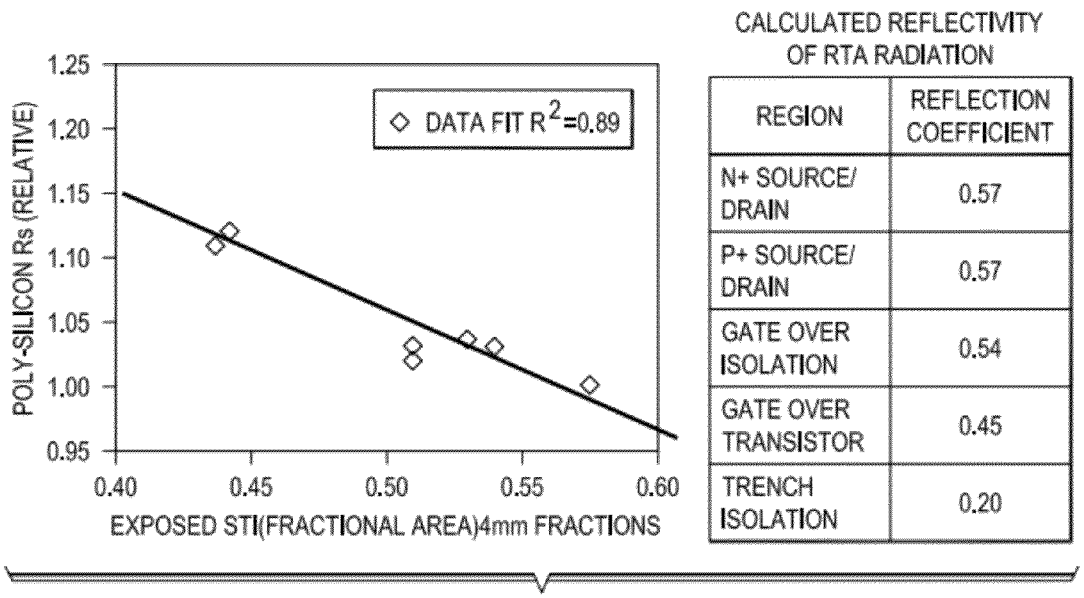
FIG. 6 is a graph depicting a correlation between poly-silicon resistors and exposed areas of shallow trench insulation not covered by poly-silicon shapes in accordance with an illustrative embodiment.

FIG. 6 is a graph depicting a correlation between poly-silicon resistors and exposed areas of shallow trench insulation not covered by poly-silicon shapes in accordance with an illustrative embodiment. This is a good model for correlating reflectivity and RTA radiation; however, this model is not complete, because it does not show the radius of effect.

In accordance with an illustrative embodiment, a model derivation component tests one or more density pattern samples, which are fabricated integrated circuits having predetermined pattern densities and careful placement of current-voltage (I-V) sensors rather than PSROs. An I-V sensor may simply be a single transistor. Thus, the density pattern samples are capable of full current and voltage measurements. The model derivation component may use drain induced barrier lowering (DIBL) effect to distinguish between threshold voltage ($V_t$) and effective channel length ($L_{eff}$) variability.

Drain induced barrier lowering (DIBL) is a secondary effect in MOSFETs referring originally to a reduction of threshold voltage of the transistor at higher drain voltages. The combined charge in the depletion region of the device and in the channel of the device is balanced by three electrode charges: the gate, the source and the drain. As drain voltage is increased, the depletion region of the p-n junction between the drain and body increases in size and extends under the gate, and the drain assumes a greater portion of the burden of balancing depletion region charge, leaving a smaller burden for the gate. As a result, the charge present on the gate retains charge balance by attracting more carriers into the channel, an effect equivalent to lowering the threshold voltage of the device.

In effect, the channel becomes more attractive for electrons. In other words, the potential energy barrier for electrons in the channel is lowered. Hence the term "barrier lowering" is used to describe these phenomena. Unfortunately, it is not easy to come up with accurate analytical results using the barrier lowering concept. Barrier lowering increases as channel length is reduced, even at zero applied drain bias, because the source and drain form p-n junctions with the body, and have associated built-in depletion layers associated with them that become significant partners in charge balance at short channel lengths, even with no reverse bias applied to increase depletion widths. The term DIBL has expanded beyond the notion of simple threshold adjustment, however, and refers to a number of drain-voltage effects upon MOSFET I-V curves that go beyond description in terms of simple threshold voltage changes, as described below.

As channel length is reduced, the effects of DIBL in the sub-threshold region (weak inversion) show up initially as a simple translation of the sub-threshold current vs. gate bias curve with change in drain-voltage, which can be modeled as a simple change in threshold voltage with drain bias. However, at shorter lengths the slope of the current vs. gate bias curve is reduced. That is, it requires a larger change in gate bias to effect the same change in drain current. At extremely short lengths, the gate entirely fails to turn the device off. These effects cannot be modeled as a threshold adjustment. DIBL also affects the current vs. drain bias curve in the active mode, causing the current to increase with drain bias, lowering the MOSFET output resistance. This increase is additional to the normal channel length modulation effect on output resistance, and cannot always be modeled as a threshold adjustment.

The density pattern samples provide a controlled environment to ensure one variability source has a much stronger effect than the other variability source. In an example embodiment, a density pattern sample may have a Dirac-like "step signal" in the pattern density. With careful placement of the sensors, the model derivation component is able to derive empirical models and establish radius of influence. The I-V sensors may include both n-channel field-effect transistor (NFET) and p-channel field-effect transistor (PFET) devices. The I-V sensors may have different sensitivity of the NFET and PFET devices to PC perimeter density.

The density pattern samples may include fill patterns from the highest possible PC perimeter density to the lowest possible density allowed on a real product. To generate a density pattern sample, one may remove the number of poly fingers in a discrete fashion, while maintaining the overall RTA signature.

Figure 7A:
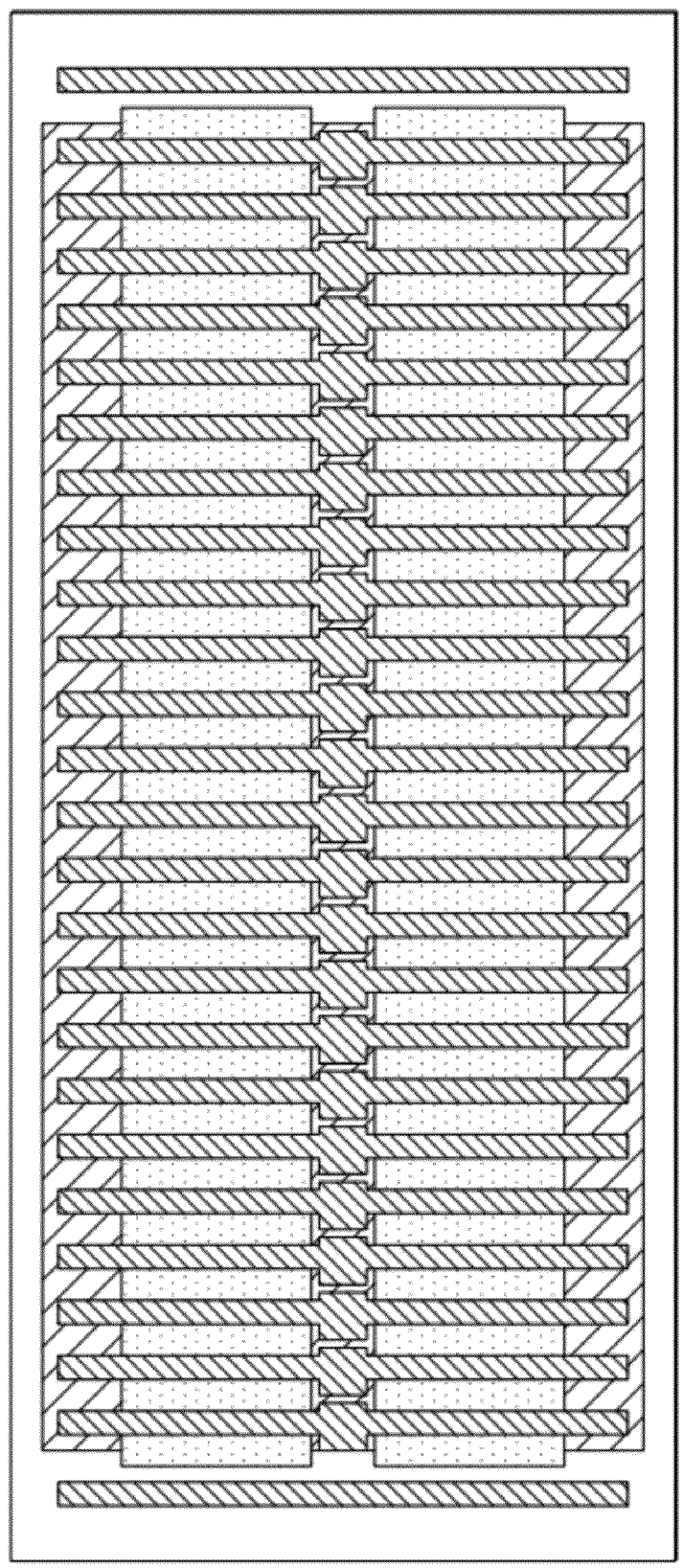
FIGS. 7A-7C depict example building blocks for density pattern models in accordance with an illustrative embodiment.
Figure 7B:
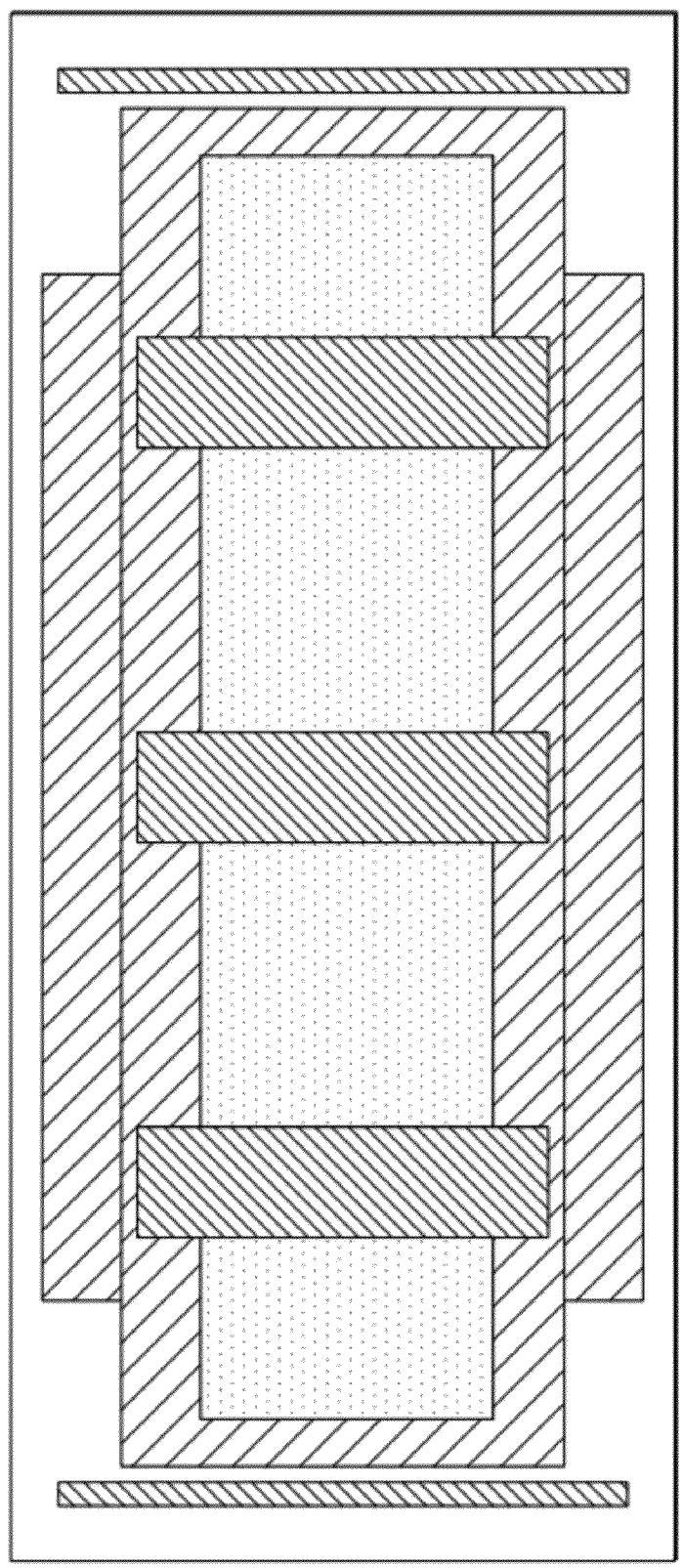
Figure 7C:
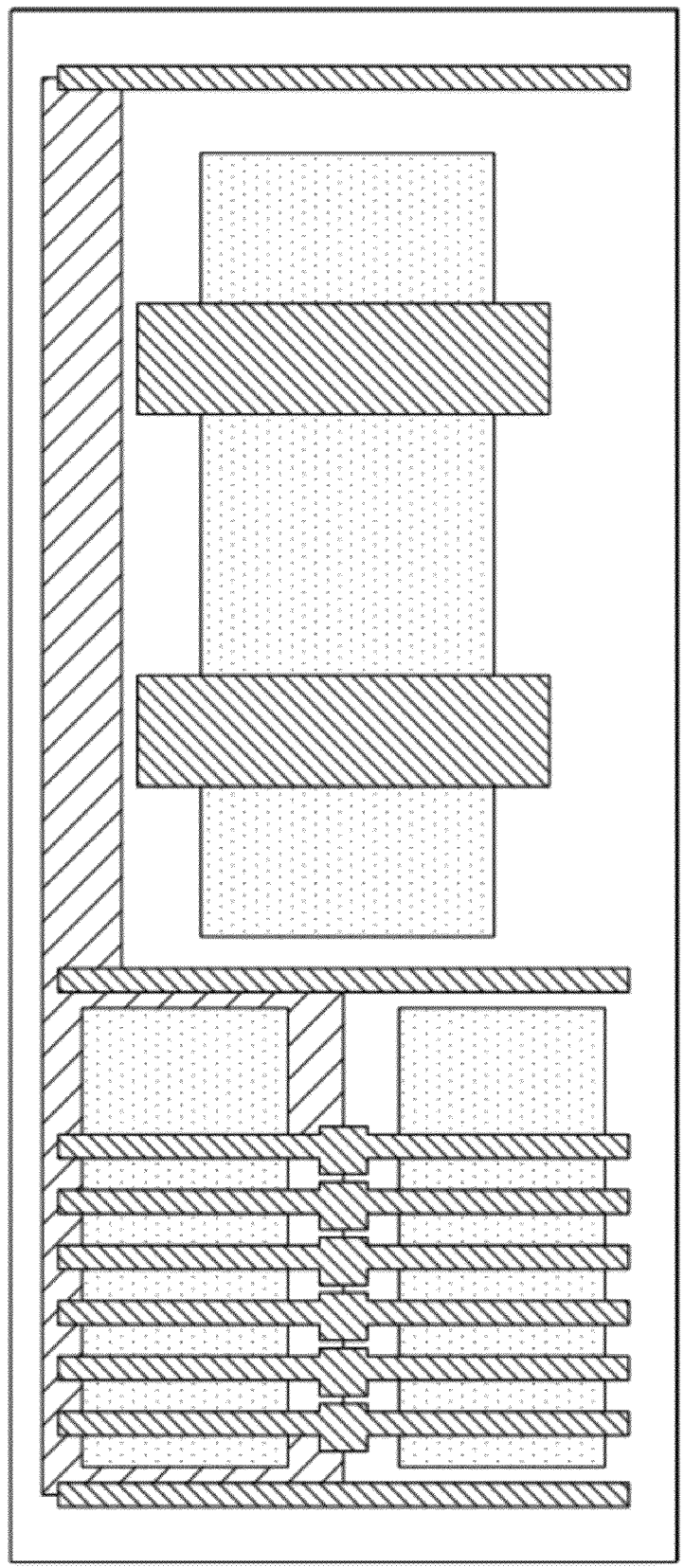

FIGS. 7A-7C depict example building blocks for density pattern models in accordance with an illustrative embodiment. FIG. 7A illustrates a building block cell with a very high, e.g., substantially 100%, PC density. FIG. 7B illustrates a building block cell with a very low, e.g., substantially 0%, PC density. FIG. 7C illustrates a building block cell with a mid-range PC density, for example 50%. These building blocks may be used, in various combinations, to design one or more density pattern models. Alternatively, more or fewer building block cells having various PC densities may be used to generate a more fine grained model.

Figure 8:
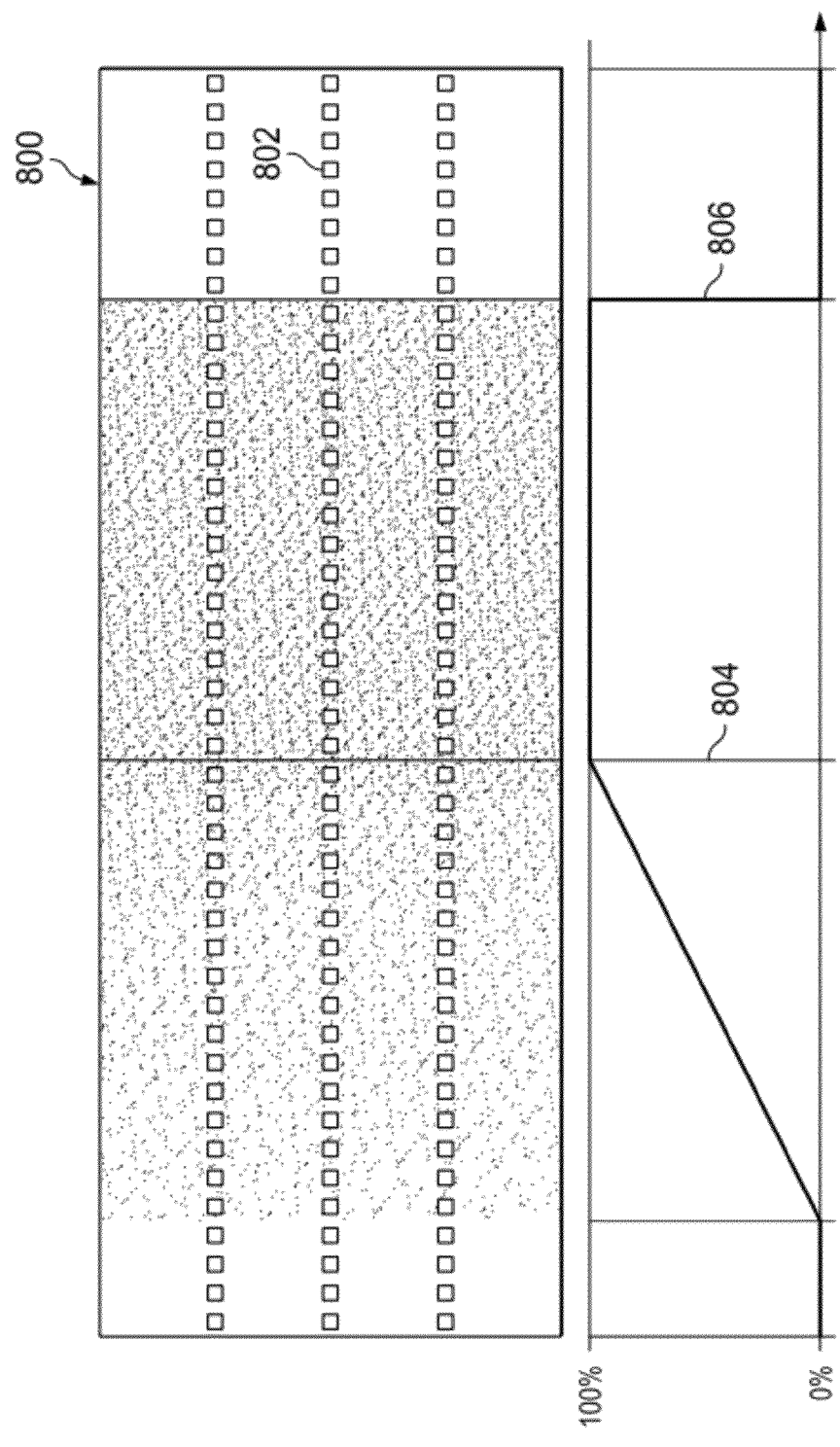
FIG. 8 depicts an example density pattern with a step pattern in accordance with an illustrative embodiment.

FIG. 8 depicts an example density pattern with a step pattern in accordance with an illustrative embodiment. Density pattern sample 800 has an increasing density and a step-like pattern density. As seen in FIG. 8, the PC perimeter density starts on the left at a lowest possible density and then increases from left to right from a lowest possible density to a highest possible density. Then at 804, the density remains at the highest possible density and drops at 806 for a Dirac-like step pattern. The step pattern at 806 allows the model derivation component to derive empirical models to isolate long range variability due to variations in PC perimeter density. Density pattern sample 800 includes rows of I-V sensors 802 to measure the voltage threshold and effective channel length variability.

Figure 9:
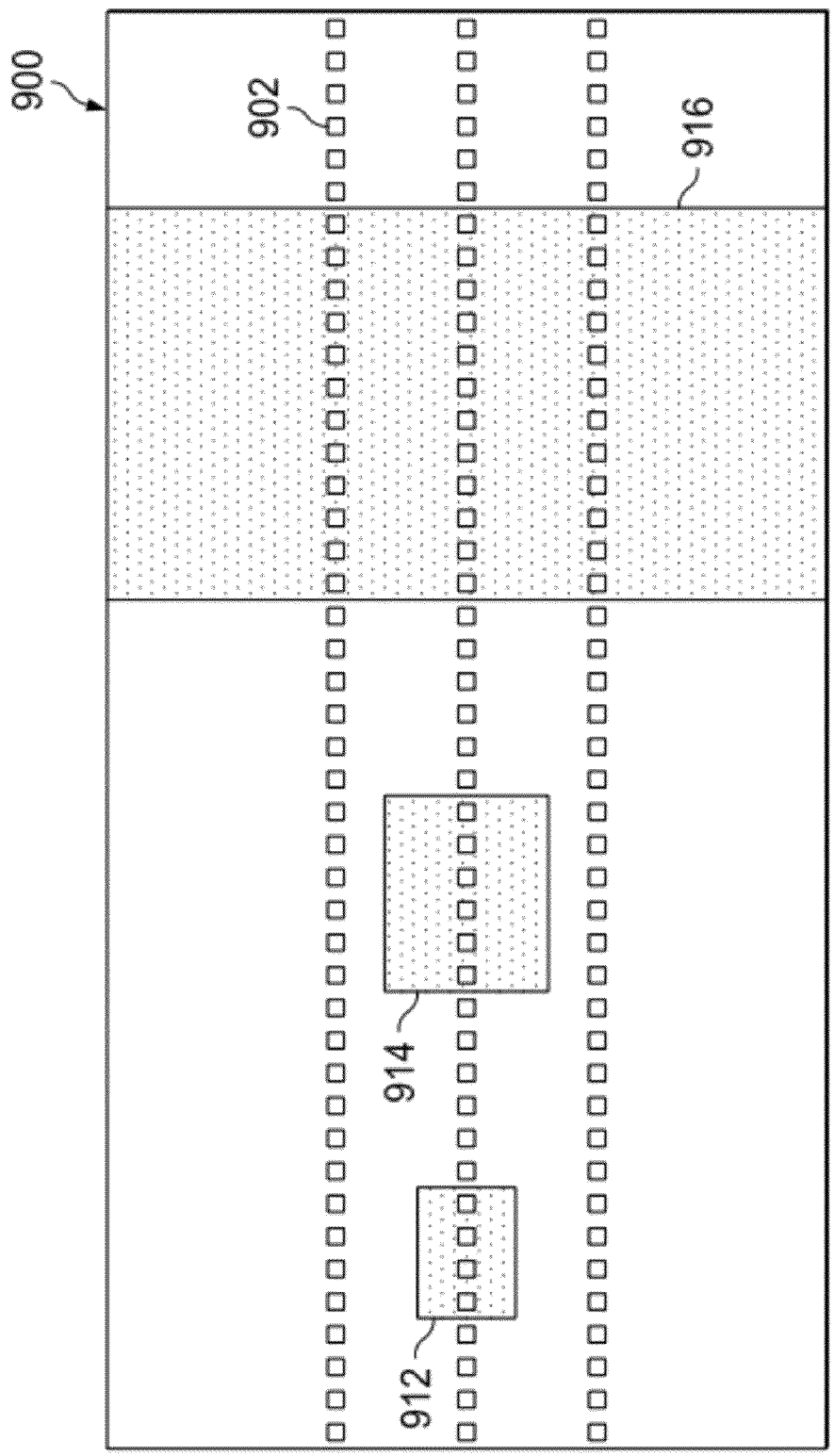
FIG. 9 depicts an example density pattern to test the isotropy of PC perimeter density effects in accordance with an illustrative embodiment.

FIG. 9 depicts an example density pattern to test the isotropy of PC perimeter density effects in accordance with an illustrative embodiment. Density pattern sample 900 has high density areas 912, 914, and 916. The remainder of density pattern sample 900 has low PC perimeter density. The density pattern sample 900 includes rows of I-V sensors 902 to measure the voltage threshold and effective channel length variability, as affected by high PC perimeter density in areas 912, 914, and 916 and low PC perimeter density in the remaining area of the density pattern. The step pattern formed between high density areas 912, 914, and 916 and the low density areas in the remainder of the density pattern sample 900 allows the model derivation component to derive empirical models to determine the radius of effect on long range variability due to variations in PC perimeter density.

In FIGS. 8 and 9, the lowest possible density may be, for example, a lowest possible density attainable having integrated circuit components that produce measurements at I-V sensors 802 or 902. A highest possible density may be, for example, a highest possible density attainable having integrated circuit components that produce measurements at I-V sensors 802 or 902. Alternatively, a lowest density may be a predetermined low density, such as 10% PC perimeter density, for example. A highest density may be a predetermined high density, such as 90% PC perimeter density, for example. The values of high density and low density may vary depending upon the implementation. In an alternative embodiment, the high density may be a predetermined amount greater than the low density, such as 80%. For instance, the lowest density may be 5% PC perimeter density, and the highest density may be 85% PC perimeter density. Thus, the highest density area is high relative to the lowest density area.

Figure 10:
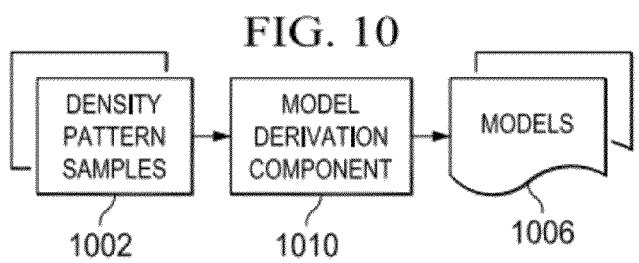
FIG. 10 is a block diagram illustrating a model derivation component in accordance with an illustrative embodiment.

FIG. 10 is a block diagram illustrating a model derivation component in accordance with an illustrative embodiment. Model derivation component 1010 tests density pattern samples 1002 by performing measurements using I-V sensors on density pattern samples 1002. Density pattern samples 1002 may include density pattern sample 800 in FIG. 8 and/or density pattern sample 900 in FIG. 9, for example. In other embodiments, density pattern samples 1002 may include more complex density patterns to isolate various effects of RTA and PC perimeter density on long range variability.

Model derivation component 1010 receives measurements from density pattern samples 1002 and generates models 1006. Models 1006 may be empirical models that represent long range variability as it correlates to RTA effects and PC perimeter density effects, as determined from the measurements from density pattern samples 1002. Models 1006 may then be used to analyze integrated circuit designs to determine whether the integrated circuit designs are likely to have problems due to long range variability.

Model derivation component 1010 may be embodied on a data processing system, such as data processing system 100 in FIG. 1, for example.

Figure 11:
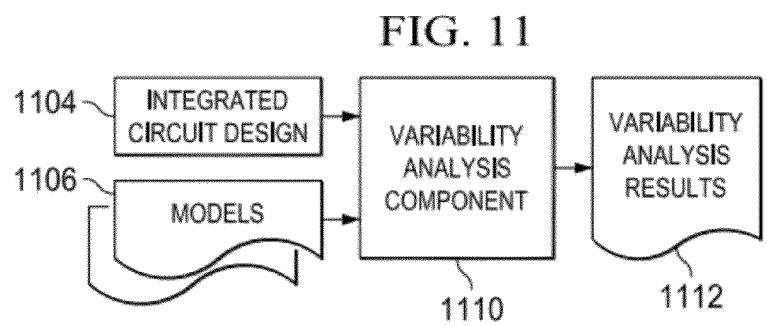
FIG. 11 is a block diagram illustrating a variability analysis component in accordance with an illustrative embodiment.

FIG. 11 is a block diagram illustrating a variability analysis component in accordance with an illustrative embodiment. Variability analysis component 1110 receives an integrated circuit design 1104 and analyzes integrated circuit design 1104 using models 1106. Variability analysis component 1110 generates variability analysis results 1112, which may determine areas of integrated circuit design 1104 that may have problems due to long range variability.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In addition, the program code may be embodied on a computer readable storage medium on the server or the remote computer and downloaded over a network to a computer readable storage medium of the remote computer or the users' computer for storage and/or execution. Moreover, any of the computing systems or data processing systems may store the program code in a computer readable storage medium after having downloaded the program code over a network from a remote computing system or data processing system.

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 12:
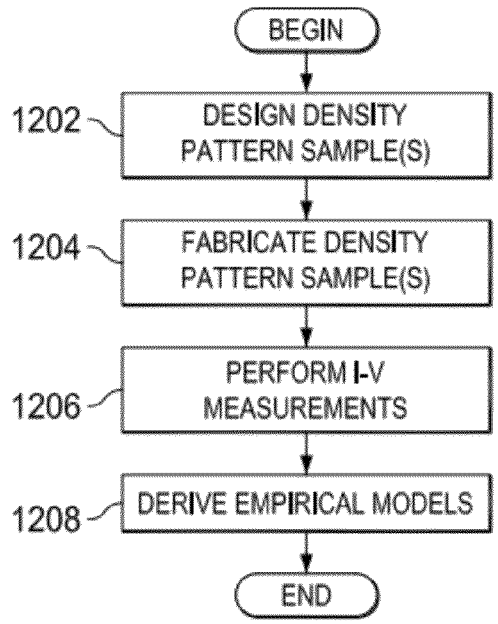
FIG. 12 is a flowchart illustrating operation of a model derivation component in accordance with an illustrative embodiment.

FIG. 12 is a flowchart illustrating operation of a model derivation component in accordance with an illustrative embodiment. Operation begins, and one designs one or more density pattern samples (block 1202) and fabricates the one or more density pattern samples (block 1204). Then, a model derivation component performs current-voltage (I-V) measurements across the one or more density pattern samples (block 1206). Next, the model derivation component uses the measurements and knowledge of the one or more density pattern sample designs to derive empirical models (block 1208). Thereafter, operation ends.

The empirical models represent long range variability as it correlates to RTA effects and PC perimeter density effects, as determined from the measurements from the one or more density pattern samples. The empirical models may then be used to analyze integrated circuit designs to determine whether the integrated circuit designs are likely to have problems due to long range variability.

Figure 13:
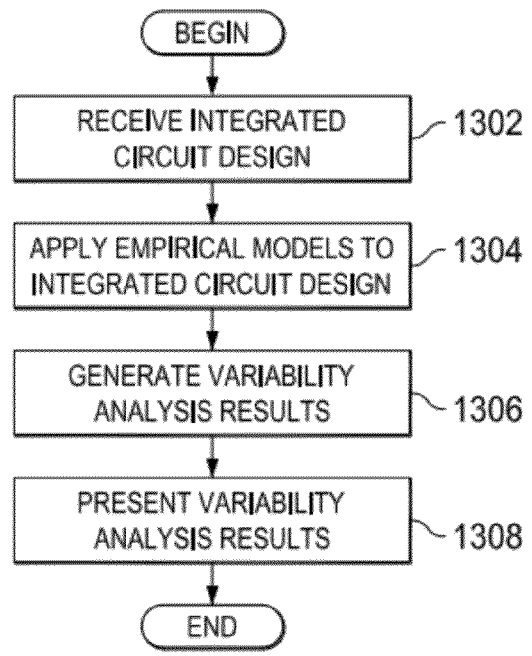
FIG. 13 is a flowchart illustrating operation of a variability analysis component in accordance with an illustrative embodiment.

FIG. 13 is a flowchart illustrating operation of a variability analysis component in accordance with an illustrative embodiment. Operation begins, and the variability analysis component receives an integrated circuit design (block 1302). The variability analysis component applies the empirical models to the integrated circuit design (block 1304) and generates variability analysis results (block 1306). The variability analysis component then presents the variability analysis results to a user (block 1308), and operation ends.

Thus, the illustrative embodiments provide mechanisms for characterizing long range variability in integrated circuit manufacturing. A model derivation component tests one or more density pattern samples, which are a fabricated integrated circuits having predetermined pattern densities and careful placement of current-voltage (I-V) sensors. The model derivation component generates one or more empirical models to establish range of influence of long range variability effects in the density pattern sample. A variability analysis component receives an integrated circuit design and, using the one or more empirical models, analyzes the integrated circuit design to isolate possible long range variability effects in the integrated circuit design.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for characterizing variability in manufacturing an integrated circuit design, the method comprising:
   fabricating one or more pattern samples, wherein each of the one or more pattern samples is an integrated circuit having a predetermined pattern and a plurality of current-voltage sensors;
   performing measurements across the plurality of current-voltage sensors;
   generating one or more data models based on the measurements;
   receiving, by the data processing system, an integrated circuit design to be analyzed;
   applying, by the data processing system, the one or more data models to the integrated circuit design to identify potential problems due to variability;
   generating, by the data processing system, variability analysis results based on application of the one or more data models to the integrated circuit design; and
   presenting, by the data processing system, the variability analysis results.

2. The method of claim 1, wherein the one or more pattern samples comprise a density pattern model, wherein the density pattern model is an integrated circuit having a predetermined polycrystalline silicon perimeter density pattern.

3. The method of claim 2, wherein the predetermined polycrystalline silicon perimeter density pattern comprises a Dirac-like step pattern.

4. The method of claim 2, wherein the predetermined polycrystalline silicon perimeter density pattern comprises a first area with a first density and a second area with a second density.

5. The method of claim 4, wherein the first density is a predetermined amount higher than the second density.

6. The method of claim 2, wherein applying the one or more data models to the integrated circuit design comprises:
   identifying potential effects of polycrystalline silicon perimeter density on performance of the integrated circuit design.

7. The method of claim 1, wherein the one or more pattern samples comprise reflectivity pattern model, wherein the reflectivity pattern model is an integrated circuit having a predetermined reflectivity pattern formed using rapid thermal annealing.

8. The method of claim 7, wherein applying the one or more data models to the integrated circuit design comprises:
   identifying potential effects of rapid thermal annealing on performance of the integrated circuit design.

9. The method of claim 1, wherein the one or more data models represent variability as it correlates to rapid thermal annealing effects and polycrystalline perimeter density effects as determined from the measurements from the one or more pattern samples.

10. A computer program product comprising a computer readable storage medium having a computer readable program recorded thereon, wherein the computer readable program, when executed on a computing device, causes the computing device to:

receive an integrated circuit design to be analyzed;

apply one or more data models to the integrated circuit design to identify potential problems due to variability, wherein the one or more data models are generated by fabricating one or more pattern samples, wherein each of the one or more pattern samples is an integrated circuit having a predetermined pattern and a plurality of current-voltage sensors, and performing measurements across the plurality of current-voltage sensors;

generate variability analysis results based on application of the one or more data models to the integrated circuit design; and present the variability analysis results.

11. The computer program product of claim 10, wherein the one or more pattern samples comprise a density pattern model, wherein the density pattern model is an integrated circuit having a predetermined polycrystalline silicon perimeter density pattern.

12. The computer program product of claim 11, wherein the predetermined polycrystalline silicon perimeter density pattern comprises a Dirac-like step pattern.

13. The computer program product of claim 11, wherein the predetermined polycrystalline silicon perimeter density pattern comprises a first area with a first density and a second area with a second density.

14. The computer program product of claim 11, wherein applying the one or more data models to the integrated circuit design comprises:

identifying potential effects of polycrystalline silicon perimeter density on performance of the integrated circuit design.

15. The computer program product of claim 10, wherein the one or more pattern samples comprise a reflectivity pattern model, wherein the reflectivity pattern model is an integrated circuit having a predetermined reflectivity pattern formed using rapid thermal annealing.

16. The computer program product of claim 15, wherein applying the one or more data models to the integrated circuit design comprises:

identifying potential effects of rapid thermal annealing on performance of the integrated circuit design.

17. The computer program product of claim 10, wherein the computer readable program is stored in a computer readable storage medium in a data processing system and wherein the computer readable program was downloaded over a network from a remote data processing system.

18. The computer program product of claim 10, wherein the computer readable program is stored in a computer readable storage medium in a server data processing system and wherein the computer readable program is downloaded over a network to a remote data processing system for use in a computer readable storage medium with the remote system.

19. The computer program product of claim 10, wherein the one or more data models represent variability as it correlates to rapid thermal annealing effects and polycrystalline perimeter density effects as determined from the measurements from the one or more pattern samples.

20. An apparatus, comprising:

a processor; and a memory coupled to the processor, wherein the memory comprises instructions which, when executed by the processor, cause the processor to:

receive an integrated circuit design to be analyzed;

apply one or more data models to the integrated circuit design to identify potential problems due to variability, wherein the one or more data models are generated by fabricating one or more pattern samples, wherein each of the one or more pattern samples is an integrated circuit having a predetermined pattern and a plurality of current-voltage sensors, and performing measurements across the plurality of current-voltage sensors;

generate variability analysis results based on application of the one or more data models to the integrated circuit design; and present the variability analysis results.

21. The apparatus of claim 20, wherein the one or more pattern samples comprise a density pattern model, wherein the density pattern model is an integrated circuit having a predetermined polycrystalline silicon perimeter density pattern, wherein applying the one or more data models to the integrated circuit design comprises:

identifying potential effects of polycrystalline silicon perimeter density on performance of the integrated circuit design.

22. The apparatus of claim 20, wherein the one or more pattern samples comprise a reflectivity pattern model, wherein the reflectivity pattern model is an integrated circuit having a predetermined reflectivity pattern formed using rapid thermal annealing, wherein applying the one or more data models to the integrated circuit design comprises:

identifying potential effects of rapid thermal annealing on performance of the integrated circuit design.

23. The apparatus of claim 20, wherein the one or more data models represent variability as it correlates to rapid thermal annealing effects and polycrystalline perimeter density effects as determined from the measurements from the one or more pattern samples.

* * * * *